(12) United States Patent
Uejima (10) Patent No.: US 8,804,362 B2
(45) Date of Patent: Aug. 12, 2014

(54) HIGH-FREQUENCY MODULE

(75) Inventor: Takanori Uejima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 130 days.

(21) Appl. No.: 13/371,649

(22) Filed: Feb. 13, 2012

(65) Prior Publication Data

US 2012/0206886 A1 Aug. 16, 2012

(30) Foreign Application Priority Data

Feb. 14, 2011 (JP) ................................. 2011-028061

(51) Int. Cl.
| | |
|---|---|
| H05K 1/18 | (2006.01) |
| H02B 1/00 | (2006.01) |
| H05K 5/00 | (2006.01) |
| H05K 7/00 | (2006.01) |
| H05K 1/00 | (2006.01) |
| H04B 1/00 | (2006.01) |
| H04B 1/04 | (2006.01) |
| H04B 1/48 | (2006.01) |
| H01L 21/66 | (2006.01) |

(52) U.S. Cl.
CPC .............. *H04B 1/006* (2013.01); *H04B 1/0466* (2013.01); *H04B 1/48* (2013.01); *H01L 22/32* (2013.01)
USPC ...... 361/762; 361/600; 361/679.01; 361/748; 361/761; 361/763

(58) Field of Classification Search
USPC ............. 361/763, 748, 761, 760, 679.01, 600
See application file for complete search history.

(56) References Cited

U.S. PATENT DOCUMENTS

| | | | |
|---|---|---|---|
| 4,922,377 A | 5/1990 | Matsumoto et al. | |
| 5,977,763 A | 11/1999 | Loughmiller et al. | |
| 6,448,798 B1 | 9/2002 | Shinmori | |
| 6,611,635 B1* | 8/2003 | Yoshimura et al. | 385/14 |
| 6,870,241 B2* | 3/2005 | Nakatani et al. | 257/531 |
| 7,221,192 B1 | 5/2007 | Talbot | |
| 7,437,129 B2* | 10/2008 | Nakajima et al. | 455/83 |
| 2002/0190742 A1 | 12/2002 | Ooishi | |

(Continued)

FOREIGN PATENT DOCUMENTS

| | | |
|---|---|---|
| JP | 08-106799 A | 4/1996 |
| JP | 2000-009808 A | 1/2000 |

(Continued)

OTHER PUBLICATIONS

Official Communication issued in corresponding Japanese Patent Application No. 2011-028061, mailed on Mar. 28, 2013.

(Continued)

*Primary Examiner* — Tuan T Dinh
*Assistant Examiner* — Ahmad D Barnes
(74) *Attorney, Agent, or Firm* — Keating & Bennett, LLP (57) ABSTRACT

In a high-frequency module, a laminate including a plurality of dielectric layers each including an electrode pattern located thereon, and a switch element which includes a test terminal arranged to output a negative voltage applied to the switch element and which is mounted on the laminate, are integrally formed. A test external terminal for external connection which outputs a signal to the outside is provided on a back surface of the laminate. The laminate includes a voltage transmission path electrically connecting the test terminal to the test external terminal.

4 Claims, 6 Drawing Sheets

(56) References Cited

U.S. PATENT DOCUMENTS

| | | |
|---|---|---|
| 2004/0032706 A1 | 2/2004 | Kemmochi et al. |
| 2004/0212387 A1 | 10/2004 | Muraya et al. |
| 2005/0208914 A1* | 9/2005 | Ogawa ................ 455/193.1 |
| 2006/0012442 A1 | 1/2006 | Shinbo et al. |
| 2008/0113625 A1 | 5/2008 | Maeda et al. |
| 2009/0093270 A1 | 4/2009 | Block et al. |

FOREIGN PATENT DOCUMENTS

| | | |
|---|---|---|
| JP | 2001-059855 A | 3/2001 |
| JP | 2001-083217 A | 3/2001 |
| JP | 2001-166382 A | 6/2001 |
| JP | 2002-365336 A | 12/2002 |
| JP | 2003-008432 A | 1/2003 |
| JP | 2004-327482 A | 11/2004 |
| JP | 2006-033108 A | 2/2006 |
| JP | 2006-295026 A | 10/2006 |
| JP | 2006-296170 A | 10/2006 |
| JP | 2006-319512 A | 11/2006 |
| JP | 2007-243094 A | 9/2007 |
| JP | 2008-124965 A | 5/2008 |
| JP | 2008-164623 A | 7/2008 |
| JP | 2009-531882 A | 9/2009 |
| JP | 2010-038764 A | 2/2010 |

OTHER PUBLICATIONS

Official Communication issued in corresponding United Kingdom Application No. 1201871.9, mailed on Jul. 12, 2012.

* cited by examiner

HIGH-FREQUENCY MODULE

BACKGROUND OF THE INVENTION

1. Field of the Invention

The present invention relates to a high-frequency module for use in an information communication apparatus such as a cellular phone, for example.

2. Description of the Related Art

In the related art, various high-frequency modules for transmitting and receiving a plurality of high-frequency signals using different frequency bands with one antenna have been devised. Such a high-frequency module in general includes a switch module which performs switching between high-frequency signals, switching between transmission and reception of each high-frequency signal, and the like, a power amplifier module on a receiving side, and a SAW (Surface Acoustic Wave) filter module on a transmitting side. The high-frequency module is formed as an integrated module in which each module is finally packaged.

For example, the high-frequency module disclosed in Japanese Unexamined Patent Application Publication No. 2006-319512 is composed of a module substrate formed by a laminate having a predetermined electrode pattern, and a SAW filter and the like which are mounted on a principal surface of the module substrate.

Further, the switch module includes a high-frequency integrated circuit (hereinafter, referred to as high-frequency IC: Integrated Circuit), and the high-frequency IC in general often includes a PLL (Phase Locked Loop) circuit (e.g., see Japanese Unexamined Patent Application Publication No. 2006-33108). The PLL circuit often uses a charge pump circuit as a power supply circuit.

However, when the high-frequency IC, which is disclosed in Japanese Unexamined Patent Application Publication No. 2006-33108 and includes the charge pump circuit, is configured as an integrated high-frequency module as disclosed in Japanese Unexamined Patent Application Publication No. 2006-319512, the high-frequency IC may malfunction or may not operate as a result of the modularization.

Further, it is known that when modularized as disclosed in Japanese Unexamined Patent Application Publication No. 2006-319512, a high-frequency IC (Integrated Circuit) which is to be mounted and has a connection terminal to be connected to an electrode of a substrate is mounted on the substrate and subjected to resin molding. In this case, even when a combination of characteristics is adjusted prior to the modularization, the characteristics of the high-frequency IC change due to factors such as generation of static electricity in a modularizing step. As a result, the characteristics of the high-frequency module are different from design standards.

Further, as one of the factors for the characteristic change of the high-frequency IC, it is known that a power supply circuit section of the high-frequency IC breaks down and cannot apply a necessary voltage to a predetermined functional circuit. For example, in a high-frequency IC which performs a switching operation of switching a connection between a plurality of ports, when a power supply circuit section thereof breaks down, unintended ports may be connected to each other or the switching operation itself may not be performed.

In this case, the characteristics of the high-frequency IC cannot be individually confirmed after the modularization. Thus, it is difficult to recognize whether the factor for the characteristics of the high-frequency module being different from design standards is attributed to characteristic change of the high-frequency IC or a defect such as breakage of a signal path of a module substrate section. Thus, when a defect occurs in the characteristics of the high-frequency module, a lot of time and effort must be spent to identify the factor that caused the defect and to improve the characteristics of the high-frequency module.

SUMMARY OF THE INVENTION

Accordingly, preferred embodiments of the present invention provide a high-frequency module which allows for easy and accurate inspection to determine whether or not a defect which occurs in the module is in a power supply circuit section of a high-frequency IC, even after completion of the module.

According to a preferred embodiment of the present invention, a high-frequency module includes a laminate including a plurality of dielectric layers each including an electrode pattern provided thereon; a power supply circuit section arranged to output a voltage in order for the high-frequency module to operate; and a high-frequency integrated circuit mounted on a front surface of the laminate. The high-frequency integrated circuit includes a test terminal connected to the power supply circuit section to check a voltage of the power supply circuit section, the laminate includes an external terminal provided on a back surface thereof to output a signal to an outside, and the test terminal and the external terminal are connected to each other through a voltage transmission path defined by the electrode pattern.

In this configuration, since the test terminal is provided in the high-frequency integrated circuit mounted on the laminate of the high-frequency module and the transmission path is defined in the laminate, the waveform of an output voltage from the high-frequency integrated circuit can be detected without disassembling the high-frequency module. Thus, it is made easy to detect whether the high-frequency integrated circuit normally operates as designed, and it is made easy to identify whether a defect is in the power supply circuit section of the high-frequency integrated circuit or in the module substrate based on a result of the detection when a malfunction or the like occurs in the high-frequency module.

According to a preferred embodiment of the present invention, the high-frequency module preferably further includes a capacitor including one end which is connected to the voltage transmission path and another end which is grounded.

In this configuration, a specific example where the capacitor is included as a bypass capacitor is described. Since the capacitor is provided, the test electrode side can be in an open state in high frequency as viewed from the high-frequency integrated circuit, and influence of high-frequency noise on the high-frequency integrated circuit can be significantly reduced and prevented.

According to a preferred embodiment of the present invention, the high-frequency module preferably further includes an inductor connected in series along the voltage transmission path.

In this configuration, a specific example where the inductor is included in order to reduce influence of high-frequency noise on the high-frequency integrated circuit is described. Since the inductor is provided, the test electrode side can be in an open state in high frequency as viewed from the high-frequency integrated circuit.

According to a preferred embodiment of the present invention, in the high-frequency module, the high-frequency integrated circuit may preferably include at least one common terminal and a plurality of individual terminals and may be a switching element switching a path which connects the common terminal to the individual terminal, the laminate may include a plurality of communication signal paths electrically connecting the external terminal through an electrode located on an uppermost layer defining the front surface of the laminate to an electrode located on a lowermost layer defining the back surface of the laminate, and the communication signal paths may be arranged so as not to overlap the voltage transmission path in a lamination direction.

In this configuration, since the voltage transmission path and the communication signal paths do not overlap each other in the lamination direction of the laminate, coupling (electromagnetic coupling or electrostatic coupling, etc.) between the voltage transmission path and the communication signal paths along the lamination direction can be prevented and suppressed, and influence of a current, which flows through the voltage transmission path, on the communication signal paths to cause a malfunction of the high-frequency module can be reduced.

According to a preferred embodiment of the present invention, in the high-frequency module, the high-frequency integrated circuit may include at least one common terminal and a plurality of individual terminals and may be a switching element switching a path which connects the common terminal to the individual terminal, the laminate may include a dielectric layer including a ground electrode located thereon, and a plurality of communication signal paths electrically connecting the external terminal through an electrode located on an uppermost layer defining the front surface of the laminate to an electrode located on a lowermost layer defining the back surface of the laminate, and at least a portion of the communication signal paths may be arranged so as to sandwich the voltage transmission path and the ground electrode in a lamination direction.

In this configuration, even when the voltage transmission path and the communication signal paths overlap each other in the lamination direction of the laminate, coupling can be prevented and suppressed due to the connection through the ground electrode, and influence of a current, which flows through the voltage transmission path, on the communication signal paths to cause a malfunction of the high-frequency module can be prevented and reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of a high-frequency module according to the present invention will be described with reference to the drawings.

In a preferred embodiment described below, a high-frequency module which performs transmission and reception of communication signals of GSM (Global System for Mobile Communications) 850, communication signals of GSM 900, communication signals of GSM 1800, and communication signals of GSM 1900 and transmission and reception of communication signals of W-CDMA (Wideband Code Division Multiple Access) communication system and the like, for example, will be described.

It should be noted that the number of the types pf communication signals is not limited to the above examples. In addition, an example where a transmitting/receiving circuit for two types of communication signals is included will be described below, but the transmitting/receiving circuit for these communication signals suffices can be set in accordance with the number of communication signals.

Figure 1:
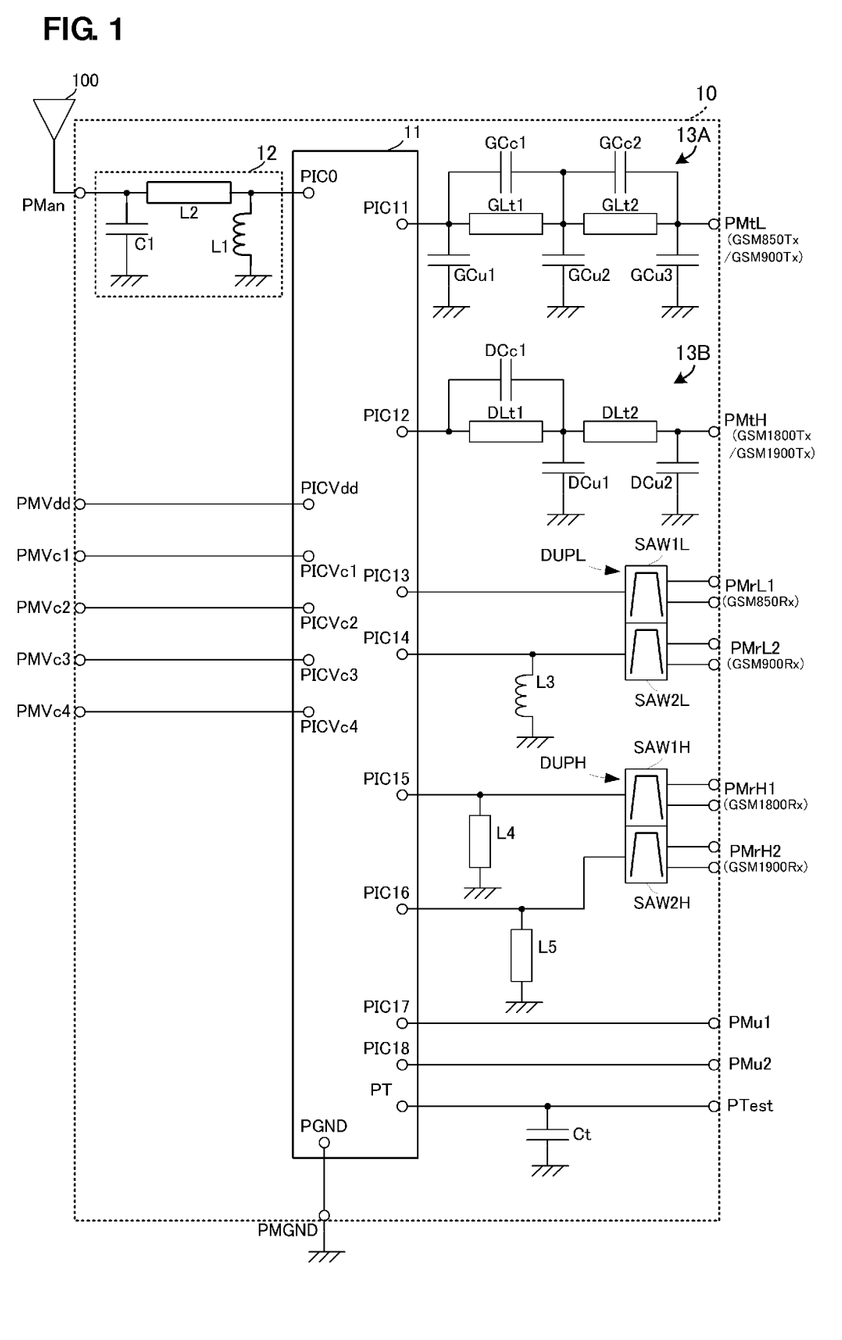
FIG. 1 is a block diagram showing the circuit configuration of a high-frequency module according to a preferred embodiment of the present invention.

FIG. 1 is a block diagram showing the circuit configuration of the high-frequency module according to the present preferred embodiment.

The high-frequency module 10 includes a switch element (high-frequency integrated circuit) 11. The switch element 11 includes a ground terminal PGND to be connected to a ground. The ground terminal PGND is connected to a ground port electrode PMGND for external connection of the high-frequency module 10.

The switch element 11 includes a drive voltage application terminal PICVdd. The drive voltage application terminal PICVdd is connected to a power supply port electrode PMVdd for external connection of the high-frequency module 10. The switch element 11 is driven by a voltage being applied thereto from the drive voltage application terminal PICVdd.

The switch element 11 includes a plurality of control voltage application terminals PICVc1, PICVc2, PICVc3, and PICVc4. In addition, the switch element 11 includes a single common terminal PIC0 and eight individual terminals PIC11 to PIC18.

The control voltage application terminals PICVc1, PICVc2, PICVc3, and PICVc4 are connected to power supply port electrodes PMVc1, PMVc2, PMVc3, and PMVc4, respectively, for external connection of the high-frequency module 10. The switch element 11 connects the common terminal PIC0 to any one of the eight individual terminals PIC11 to PIC18 on the basis of a combination of control voltages Vc1, Vc2, Vc3, and Vc4 which are applied to the control voltage application terminals PICVc1, PICVc2, PICVc3, and PICVc4, respectively (e.g., a positive voltage, a negative voltage, a negative voltage, and a negative voltage are applied as the control voltages Vc1, Vc2, Vc3, and Vc4).

The common terminal PIC0 is connected to an antenna connection external terminal PMan of the high-frequency module 10 through an antenna-side matching circuit 12 which serves as an ESD (Electrostatic Discharge) circuit. The antenna connection external terminal PMan is connected to an external antenna 100.

The antenna-side matching circuit 12 includes an inductor L2 connected in series between the antenna connection external terminal PMan of the high-frequency module 10 and the common terminal PIC0. The end of the inductor L2 on the antenna connection external terminal PMan side is grounded through a capacitor C1. The end of the inductor L2 on the common terminal PIC0 side is grounded through an inductor L1 which mainly serves as an ESD element.

The individual terminal PIC11 is connected to an individual external terminal PMtL of the high-frequency module 10 through a receiving-side filter 13A. The individual external terminal PMtL is a terminal to which transmission signals of GSM 850 and GSM 900 are inputted from the outside.

The receiving-side filter 13A includes inductors GLt1 and GLt2 connected in series between the individual terminal PIC11 and the individual external terminal PMtL. The inductors GLt1 and GLt2 are connected in order of the inductor GLt1 and the inductor GLt2 from the individual terminal PIC11 side. The end of the inductor GLt1 on the individual terminal PIC11 side is grounded through a capacitor GCu1. The connection point between the inductors GLt1 and GLt2 is grounded through a capacitor GCu2. The end of the inductor GLt2 on the individual external terminal PMtL side is grounded through a capacitor GCu3.

A capacitor GCc1 is connected in parallel to the inductor GLt1. When the element value of this parallel resonant circuit is set to a predetermined value, a characteristic of greatly attenuating transmission signals inputted from the individual external terminal PMtL, namely, double harmonics of transmission signals of GSM 850 or GSM 900, is achieved.

A capacitor GCc2 is connected in parallel to the inductor GLt2. When the element value of this parallel resonant circuit is set to a predetermined value, a characteristic of greatly attenuating transmission signals inputted from the individual external terminal PMtL, namely, triple harmonics of transmission signals of GSM 850 or GSM 900, is achieved.

In other words, when the element values of each inductor and capacitor constituting the receiving-side filter 13A are set to the predetermined values, a filter is achieved which sets, as a pass band, the used frequency band of transmission signals of GSM 850 or GSM 900 and sets, as an attenuation band, the high-frequency band of transmission signals of GSM 850 or GSM 900.

The individual terminal PIC12 is connected to an individual external terminal PMtH of the high-frequency module 10 through a receiving-side filter 13B. The individual external terminal PMtH is a terminal to which transmission signals of GSM 1800 or GSM 1900 are inputted from the outside.

The receiving-side filter 13B includes inductors DLt1 and DLt2 connected in series between the individual terminal PIC12 and the individual external terminal PMtH. The inductors DLt1 and DLt2 are connected in order of the inductor DLt1 and the inductor DLt2 from the individual terminal PIC12 side. The connection point between the inductors DLt1 and DLt2 is grounded through a capacitor DCu1. The end of the inductor DLt2 on the individual external terminal PMtH side is grounded through a capacitor DCu2.

A capacitor DC1 is connected in parallel to the inductor DLt1. When the element value of this parallel resonant circuit is set to a predetermined value, a characteristic of greatly attenuating transmission signals inputted from the individual external terminal PMtH, namely, double harmonics of transmission signals of GSM 1800 or GSM 1900, is achieved. The inductor DLt2 achieves a characteristic of greatly attenuating transmission signals inputted from the individual external terminal PMtH, namely, triple harmonics of transmission signals of GSM 1800 or GSM 1900, when the element value thereof is set to a predetermined value.

Further, when the element values of each inductor and capacitor constituting the receiving-side filter 13B are set to the predetermined values, a filter is achieved which sets, as a pass band, the used frequency band of transmission signals of GSM 1800 or GSM 1900 and sets, as an attenuation band, the high-frequency band including double harmonics and triple harmonics of transmission signals of GSM 1800 or GSM 1900.

The individual terminal PIC13 is connected to an unbalanced terminal of a SAW filter SAW1L of a SAW duplexer DUPL. The SAW filter SAW1L is a filter which sets the frequency band of reception signals of GSM 850 as a pass band, and has a balance-unbalance conversion function. A balanced terminal of the SAW filter SAW1L is connected to an individual external terminal PMrL1 of the high-frequency module 10. The individual external terminal PMrL1 is a terminal from which reception signals of GSM 850 are inputted.

The individual terminal PIC14 is connected to an unbalanced terminal of a SAW filter SAW2L of the SAW duplexer DUPL. A matching inductor L3 is connected between a ground potential and a transmission line connecting the individual terminal PIC14 to the SAW filter SAW2L. The SAW filter SAW2L is a filter which sets the frequency band of reception signals of GSM 900 as a pass band, and has a balance-unbalance conversion function. A balanced terminal of the SAW filter SAW2L is connected to an individual external terminal PMrL2 of the high-frequency module 10. The individual external terminal PMrL2 is a terminal from which reception signals of GSM 900 are outputted.

The individual terminal PIC15 is connected to an unbalanced terminal of a SAW filter SAW1H of a SAW duplexer DUPH. A matching inductor L4 is connected between the ground potential and a transmission line connecting the individual terminal PIC15 to the SAW filter SAW1H. The SAW filter SAW1H is a filter which sets the frequency band of reception signals of GSM 1800 as a pass band, and has a balance-unbalance conversion function. A balanced terminal of the SAW filter SAW1H is connected to an individual external terminal PMrH1 of the high-frequency module 10. The individual external terminal PMrH1 is a terminal from which reception signals of the GSM 1800 are outputted.

The individual terminal PIC16 is connected to an unbalanced terminal of a SAW filter SAW2H of the SAW duplexer DUPH. A matching inductor L5 is connected between the ground potential and a transmission line connecting the individual terminal PIC16 to the SAW filter SAW2H. The SAW filter SAW2H is a filter which sets the frequency band of reception signals of GSM 1900 as a pass band, and has a balance-unbalance conversion function. A balanced terminal of the SAW filter SAW2H is connected to an individual external terminal PMrH2 of the high-frequency module 10. The individual external terminal PMrH2 is a terminal from which reception signals of GSM 1900 are outputted.

The individual terminal PIC17 is connected to an individual external terminal PMu1 of the high-frequency module 10. The individual external terminal PMu1 is a terminal arranged to input and output a first W-CDMA communication signal. The individual terminal PIC18 is connected to an individual external terminal PMu2 of the high-frequency module 10. The individual external terminal PMu2 is a terminal arranged to input and output a second W-CDMA communication signal.

A test terminal PT is connected to a test external terminal PTest for external connection of the high-frequency module 10. The test terminal PT is connected to a power supply circuit (e.g., output of a charge pump circuit which is not shown), and is a terminal arranged to output an output voltage of the power supply circuit. A voltage measuring device which is not shown is connected to the test external terminal PTest when it is confirmed whether the operation of the high-frequency module 10 is normal or when the cause of a malfunction of the high-frequency module 10 is inspected.

Figure 2A:
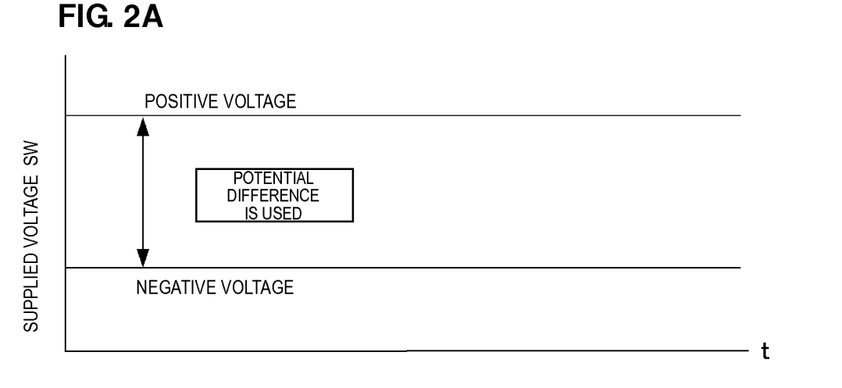
FIGS. 2A and 2B are schematic diagrams showing detected voltage waveforms.
Figure 2B:
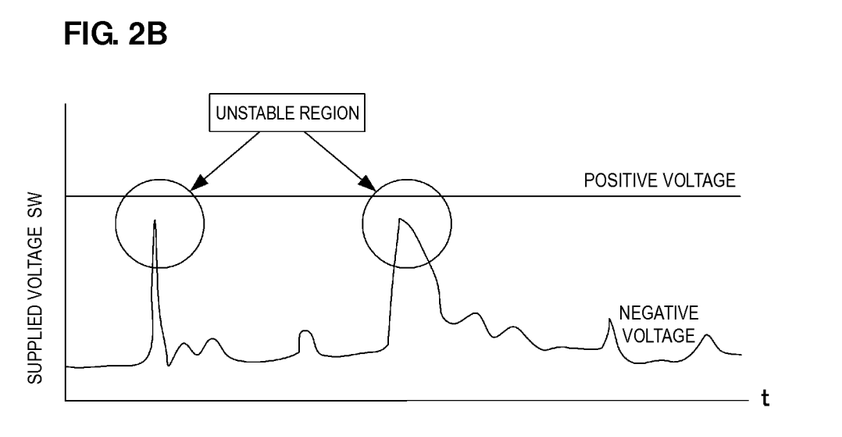

An output voltage from the test external terminal PTest of the high-frequency module 10 is detected with the voltage measuring device, whereby a voltage waveform of the power supply circuit section of the switch element 11 can be detected. FIGS. 2A and 2B are schematic diagrams showing detected voltage waveforms, and show a normal voltage waveform and an abnormal voltage waveform, respectively. In addition, in FIGS. 2A and 2B, the vertical axis indicates a voltage supplied to the switch element 11, and the horizontal axis indicates an elapsed time of power supply.

When the switch element 11 is normal, the potential difference between a positive voltage and a negative voltage is substantially uniform regardless of the elapsed time as shown in FIG. 2A. On the other hand, when the switch element 11 is abnormal, a voltage temporarily sharply increases as shown as unstable regions in FIG. 2B. As described above, from the result of the detection of the voltage waveform, it can be confirmed whether the operation of the high-frequency module 10 is normal, and in particular, it can be identified whether the cause of a malfunction of the high-frequency module 10 is in the power supply circuit of the switch element 11 or in another component.

For example, when a malfunction occurs in the high-frequency module 10, if a detected waveform is normal, an inspector can recognize that the power supply circuit section of the switch element 11 is normally operating.

A capacitor Ct is connected as a protective element between the ground potential and a transmission path between the test terminal PT and the test external terminal PTest. The capacitor Ct defines a bypass capacitor which removes noise including a high-frequency component. The capacitor Ct transmits an output signal from the test terminal PT to the connected voltage measuring device at low loss, and prevents high-frequency signals such as communication signals and high-frequency noise from being transmitted to the voltage measuring device.

Further, the capacitor Ct prevents high-frequency noise from the outside through the test external terminal PTest from being transmitted to the switch element 11.

As described above, the provision of the capacitor Ct in the high-frequency module 10 allows the influence of high-frequency noise on the switch element 11 and the voltage measuring device to be reduced.

The capacitor Ct is mounted as a bypass capacitor on a laminate 900. However, a mounted type may not be used, and the capacitor Ct may be achieved by using electrodes located on two layers of the laminate 900 and a dielectric layer interposed between the two layers.

Figure 3A:
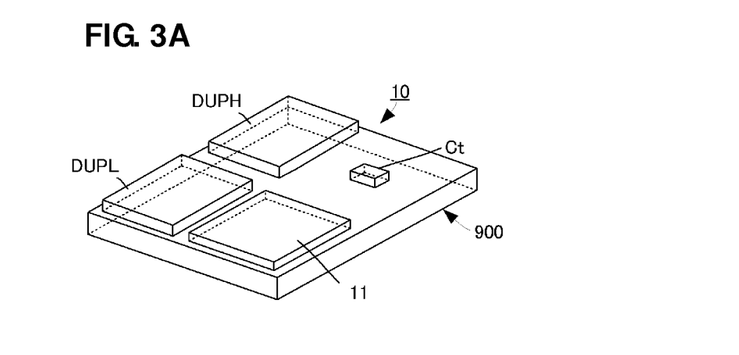
FIGS. 3A and 3B are diagrams illustrating the structure of the high-frequency module according to a preferred embodiment of the present invention.
Figure 3B:
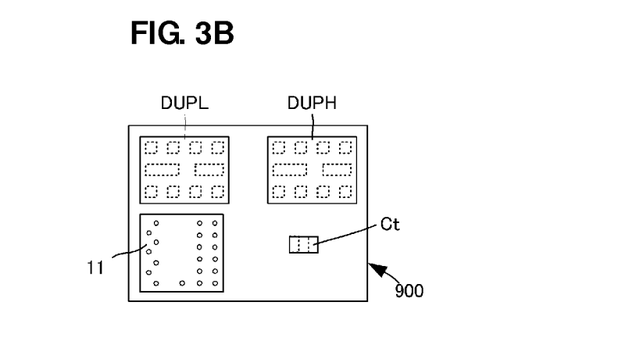
Figure 4:
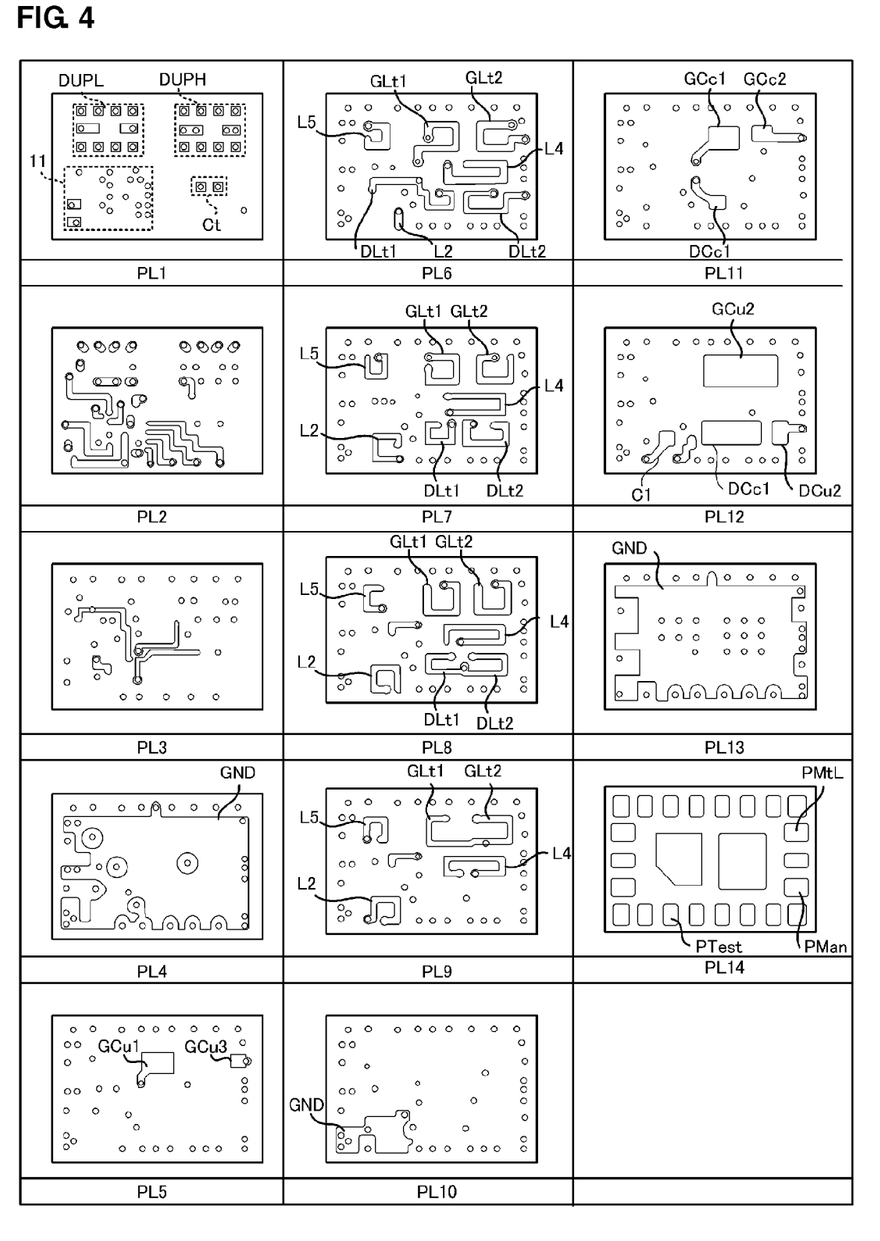
FIG. 4 is a lamination diagram of the high-frequency module.

FIGS. 3A and 3B are diagrams illustrating the structure of the high-frequency module 10 according to the present preferred embodiment. FIG. 3A shows an external perspective view, and FIG. 3B shows a top mounting diagram. FIG. 4 is a lamination diagram of the high-frequency module 10.

The high-frequency module 10 includes the laminate 900. The SAW duplexers DUPL and DUPH and the switch element 11 are mounted on the top surface of the laminate 900. In addition, the capacitor Ct is mounted on the top surface of the laminate 900.

The laminate 900 includes a predetermined number of laminated dielectric layers, and a portion of the high-frequency module 10 other than each mounted-type circuit element described above is achieved by inner-layer electrode patterns located on dielectric layers. In addition, a detailed arrangement pattern is not shown in the present preferred embodiment, but the aforementioned port electrodes for external connection are configured in a predetermined arrangement on the bottom surface of the laminate 900.

As shown in FIG. 4, the laminate 900 includes a plurality (for example, 14) of laminated dielectric layers, a predetermined electrode pattern to define the high-frequency module 10 is located on each dielectric layer, and via-electrodes connecting between layers are included. The via-electrodes are indicated by circles shown in each layer of FIG. 4. Hereinafter, a description will be provided based on the assumption that the uppermost layer which defines the top surface of the laminate 900 is referred as a first layer PL1, the number increases toward the lower layer side, and the lowermost layer is referred to as a fourteenth layer PL14.

On the top surface of the first layer PL1, which is the uppermost layer, namely, on the top surface of the laminate 900, electrodes provided to mount the SAW duplexers DUPL and DUPH, the switch element 11, and the capacitor Ct are provided.

On a second layer PL2 and a third layer PL3, drawn pattern electrodes are provided. On the third layer PL3, the drawn pattern electrode is provided and connects the test terminal PT of the switch element 11 to the capacitor Ct. The inner-layer ground electrode GND is provided on a substantially entire surface of a fourth layer PL4.

One terminal of the capacitor Ct is connected to the pattern electrode on the third layer PL3, and the other terminal of the capacitor Ct is connected to the ground electrode GND on the fourth layer PL4.

On a fifth layer PL5, one counter electrode of each of the capacitors GCu1 and GCu3 is provided. The other counter electrode of each of the capacitors GCu1 and GCu3 is the ground electrode GND on the fourth layer PL4.

On a sixth layer PL6, line electrode patterns forming the inductors GLt1, GLt2, DLt1, DLt2, L2, L4, and L5, respectively, are provided.

On a seventh layer PL7 and an eighth layer PL8 as well, line electrode patterns defining the inductors GLt1, GLt2, DLt1, DLt2, L2, L4, and L5, respectively, are provided.

On a ninth layer PL9, line electrode patterns forming the inductors GLt1 and GLt2, L2, L4, and L5, respectively, are provided.

On a tenth layer PL10 and an eleventh layer PL11, one counter electrode of each of the capacitors GCc1, GCc2, and DCc1 is provided.

On a twelfth layer PL12, one counter electrode of each of the capacitors GCu2, DCc1, DCu2, Ct, and C1 is provided. It should be noted that the one counter electrode of the capacitor GCu2 also serves as the other counter electrode of each of the capacitors GCc1 and GCc2.

An inner-layer ground electrode GND is provided on a substantially entire surface of a thirteenth layer PL13. The ground electrode GND also serves as the other counter electrode of each of the capacitors GCu2, DCc1, DCu2, and C1.

On the bottom surface of the fourteenth layer PL14, which is the lowermost layer, namely, on the bottom surface of the laminate 900, electrodes defining the individual external terminal PMtL to the individual external terminal PMu2, an electrode defining the test external terminal PTest, an electrode defining the antenna connection external terminal PMan, and a ground electrode for external connection are arranged and formed. These electrodes are arranged and formed so as to realize the circuit shown in FIG. 1, together with the aforementioned electrode pattern on each layer.

Figure 5:
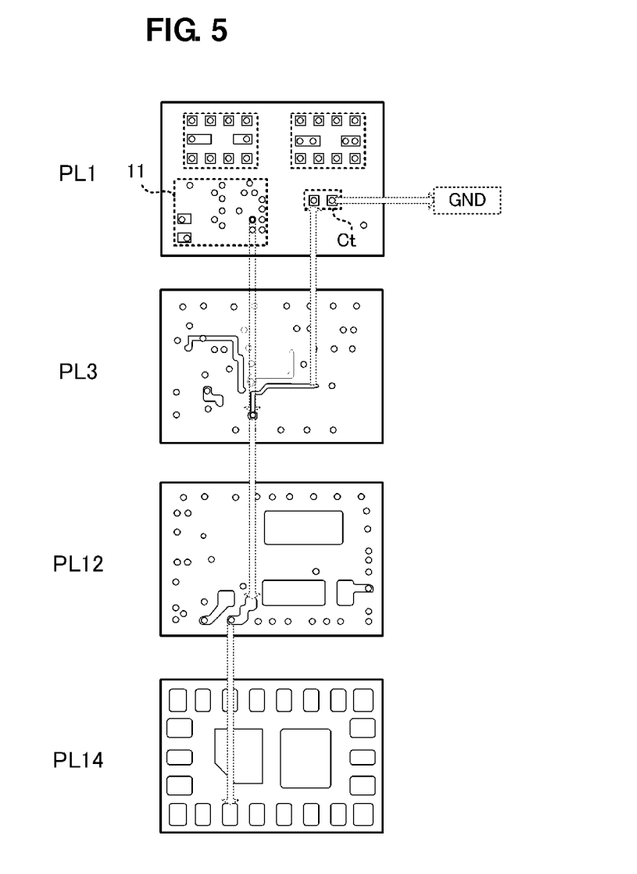
FIG. 5 is an enlarged plan view of some layers of a laminate.

In such a configuration, a capacitor Ct5 and the test terminal PT of the switch element 11 provided by an inner-layer electrode pattern are realized with a specific configuration described below. FIG. 5 is an enlarged plan view of some layers of the laminate 900.

As shown in FIG. 5, the test terminal PT of the switch element 11 is connected from the via-electrode in the first layer PL1 through the via-electrode in the third layer PL3 to the electrode located on the twelfth layer PL12. In addition, the test terminal PT of the switch element 11 is connected from the twelfth layer PL12 to the electrode, on the fourteenth layer PL14, defining the test external terminal PTest.

One electrode of the capacitor Ct is connected to the line electrode pattern located on the third layer PL3. The line electrode pattern is connected to the test terminal PT of the switch element 11. In addition, the other electrode of the capacitor Ct is connected to the ground electrode GND on the fourth layer PL4 through the via-electrode in each layer.

Due to this, the test terminal PT of the switch element 11 is connected to the test external terminal PTest of the high-frequency module 10 and is grounded through the capacitor Ct.

It should be noted that the line electrode pattern located on the second layer PL2 includes an electrode pattern drawn directly from the switch element 11. These electrode patterns are close to the switch element 11. Thus, it is desirable that the electrode pattern on the third layer PL3 is arranged so as not to overlap these electrode patterns. As a result, it is possible to reliably prevent an unwanted signal from influencing the electrode pattern on the second layer PL2 through the electrode pattern on the third layer PL3, resulting in a malfunction of the switch element 11.

In particular, a high-power transmission signal flows through the inductors GLt1, GLt2, DLt1, and DLt2 on the sixth layer PL6 to the eighth layer PL8, and thus it is desirable that the electrode pattern on the third layer PL3 is arranged so as not to overlap the electrode patterns on the sixth layer PL6 to the eighth layer PL8. When these electrode patterns overlap each other, a ground electrode GND is provided therebetween. When such a structure is provided, it is possible to reliably prevent a high-power signal flowing through the electrode pattern on the third layer PL3 to the switch element 11 to cause a malfunction of the switch element 11.

As described above, the high-frequency module 10 according to the present preferred embodiment has a configuration in which the test terminal PT which outputs an applied negative voltage is provided in the switch element 11 mounted on the high-frequency module 10 and is connected to the test external terminal PTest.

Since the waveform of a negative voltage applied to the switch element 11 can be detected through the test external terminal PTest as described above, the cause of a malfunction of the high-frequency module 10 can be identified without disassembling the high-frequency module 10, after the high-frequency module 10 is formed. For example, when the waveform of a voltage detected from the test external terminal PTest is abnormal, it can be identified that the cause of the malfunction of the high-frequency module 10 is in the switch element 11. On the other hand, when the waveform of a voltage detected from the test external terminal PTest is normal, it can be identified that the cause of the malfunction of the high-frequency module is in a component other than the switch element 11 (e.g., breakage of an electrode pattern within the module substrate). As described above, it is easy to identify a component which causes a defect, and thus it is easy to eliminate the defect.

Further, the provision of the capacitor Ct as a bypass capacitor allows influences of high-frequency noise from the test external terminal PTest on the switch element 11 to be prevented and significantly reduced.

It should be noted that instead of the capacitor Ct, an inductor may be provided between the test terminal PT of the switch element 11 and the test external terminal PTest of the high-frequency module 10 to reduce influence of high-frequency noise.

Figure 6:
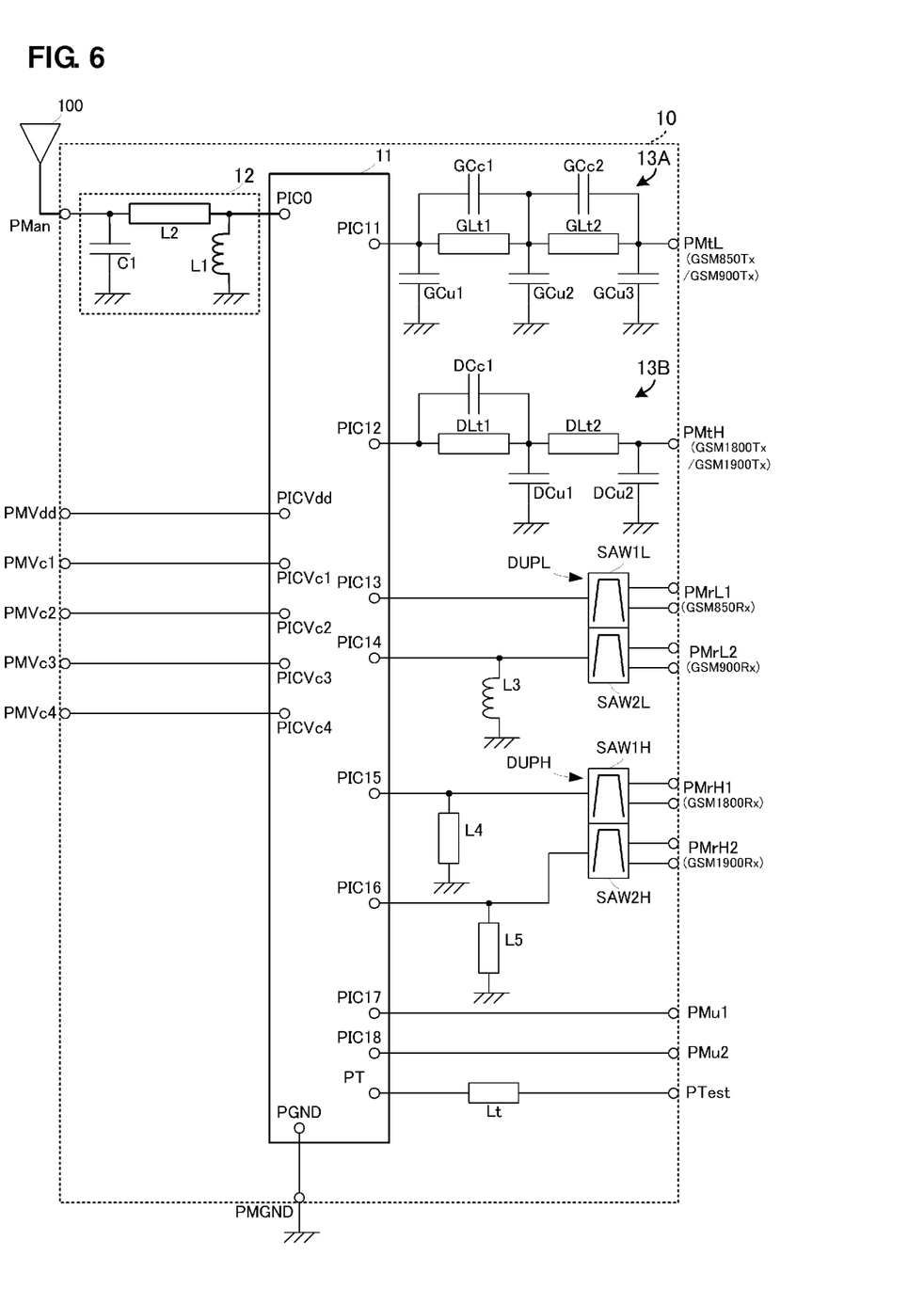
FIG. 6 is a block diagram showing the circuit configuration of the high-frequency module when an inductor is provided.

FIG. 6 is a block diagram showing the circuit configuration of the high-frequency module 10 when an inductor is provided. The inductor Lt is connected in series between the test terminal PT of the switch element 11 and the test external terminal PTest of the high-frequency module 10. In this case, for example, the inductor Lt can prevent high-frequency noise generated from the capacitor Ct from flowing to the switch element 11. In addition, when compared to the case of using the capacitor Ct, there is no connection through the ground electrode GND, and thus flow of a signal from the ground electrode GND can be eliminated.

The specific configurations of the high-frequency module 10 and the switch element 11 described above can be changed as appropriate, the advantageous effects described in the aforementioned preferred embodiments are merely described as the most preferred advantageous effects provided from the present invention, and the advantageous effects provided by the present invention are not limited to those described in the aforementioned preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising: a laminate including a plurality of dielectric layers each including an electrode pattern located thereon; a power supply circuit section arranged to output a voltage to operate the high-frequency module; and a high-frequency integrated circuit mounted on a front surface of the laminate; wherein the high-frequency integrated circuit includes a test terminal connected to the power supply circuit section to check a voltage of the power supply circuit section; the laminate includes an external terminal provided on a back surface thereof to output a signal to an outside; and the test terminal and the external terminal are connected to each other through a voltage transmission path defined by the electrode pattern; wherein the high-frequency integrated circuit includes at least one common terminal and a plurality of individual terminals; the high-frequency integrated circuit is a switching element arranged to switch a path that connects the common terminal to the plurality of individual terminals; the laminate includes a plurality of communication signal paths electrically connecting the external terminal through an electrode located on an uppermost layer defining the front surface of the laminate to an electrode located on a lowermost layer defining the back surface of the laminate; and the communication signal paths are arranged so as not to overlap the voltage transmission path in a lamination direction.

2. The high-frequency module according to claim 1, further comprising a capacitor including a first end which is connected to the voltage transmission path and a second end which is grounded.

3. The high-frequency module according to claim 1, further comprising an inductor connected in series along the voltage transmission path.

4. A high-frequency module comprising: a laminate including a plurality of dielectric layers each including an electrode pattern located thereon; a power supply circuit section arranged to output a voltage to operate the high-frequency module; and a high-frequency integrated circuit mounted on a front surface of the laminate; wherein the high-frequency integrated circuit includes a test terminal connected to the power supply circuit section to check a voltage of the power supply circuit section; the laminate includes an external terminal provided on a back surface thereof to output a signal to an outside; and the test terminal and the external terminal are connected to each other through a voltage transmission path defined by the electrode pattern; wherein the high-frequency integrated circuit includes at least one common terminal and a plurality of individual terminals; the high-frequency integrated circuit is a switching element arranged to switch a path that connects the common terminal to the plurality of individual terminals; the laminate includes a dielectric layer including a ground electrode located thereon, and a plurality of communication signal paths electrically connecting the external terminal through an electrode located on an uppermost layer defining the front surface of the laminate to an electrode located on a lowermost layer defining the back surface of the laminate; and at least a portion of the communication signal paths is arranged so as to sandwich the voltage transmission path and the ground electrode in a lamination direction of the laminate.

* * * * *